United States Patent [19]

Mruzek et al.

[11] Patent Number: 5,247,800
[45] Date of Patent: Sep. 28, 1993

[54] THERMAL CONNECTOR WITH AN EMBOSSED CONTACT FOR A CRYOGENIC APPARATUS

[75] Inventors: Michael T. Mruzek; Phillip W. Eckels, both of Florence, S.C.; Clyde L. Gouldsberry, Ypsilanti, Mich.

[73] Assignee: General Electric Company, Milwaukee, Wis.

[21] Appl. No.: 893,135

[22] Filed: Jun. 3, 1992

[51] Int. Cl.[5] ............................................. F25B 19/00
[52] U.S. Cl. ..................................... 62/51.1; 62/383; 165/185
[58] Field of Search .................. 62/51.1, 383; 165/185

[56] References Cited

U.S. PATENT DOCUMENTS

| | | | |
|---|---|---|---|
| 4,516,404 | 4/1985 | Laskaris | 62/45 |
| 4,526,015 | 7/1985 | Laskaris | 62/514 R |
| 4,535,596 | 8/1985 | Laskaris | 62/45 |
| 4,621,304 | 11/1986 | Oogaki et al. | 165/185 |
| 4,667,486 | 5/1987 | Miller et al. | 62/514 R |
| 4,667,487 | 5/1987 | Miller et al. | 62/514 R |
| 4,765,153 | 8/1988 | Wachi | 62/383 |
| 4,858,590 | 8/1989 | Bailey | 165/185 |
| 4,869,068 | 9/1989 | Van Vloten | 62/51.1 |
| 4,873,843 | 10/1989 | Volten | 62/383 |
| 4,876,413 | 10/1989 | Vermilyea | 174/15.4 |
| 4,930,318 | 6/1990 | Brzozowski | 62/51.1 |
| 4,979,074 | 12/1990 | Morley et al. | 165/185 |
| 5,070,936 | 12/1991 | Carroll et al. | 165/185 |
| 5,103,647 | 4/1992 | Ackermann | 62/6 |

*Primary Examiner*—Ronald C. Capossela
*Attorney, Agent, or Firm*—Quarles & Brady

[57] ABSTRACT

A cryogenic system, such as a superconducting magnet assembly of magnetic resonance imaging equipment, is cooled by a refrigeration unit having a first surface refrigerated to a desired temperature. The first surface has a indentation in which an indium body is bonded to the first surface. A copper thermal conductor has a second surface on which an indenter is formed. Preferably the indenter is either a spiraling peak or an array of pyramids projecting from the second surface. A mechanism is provided to hold the thermal conductor against the indium body with the indenter penetrating the body.

17 Claims, 3 Drawing Sheets

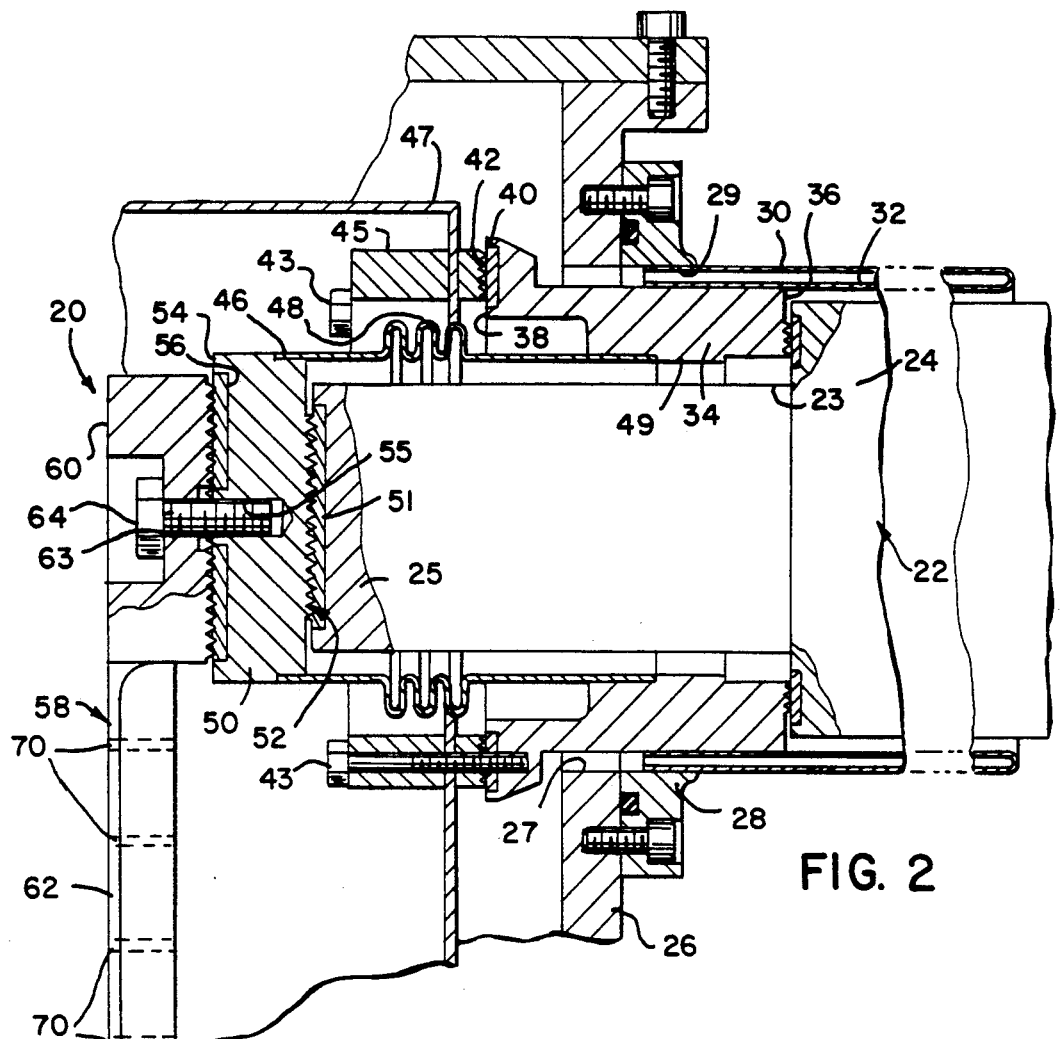
FIG. 2
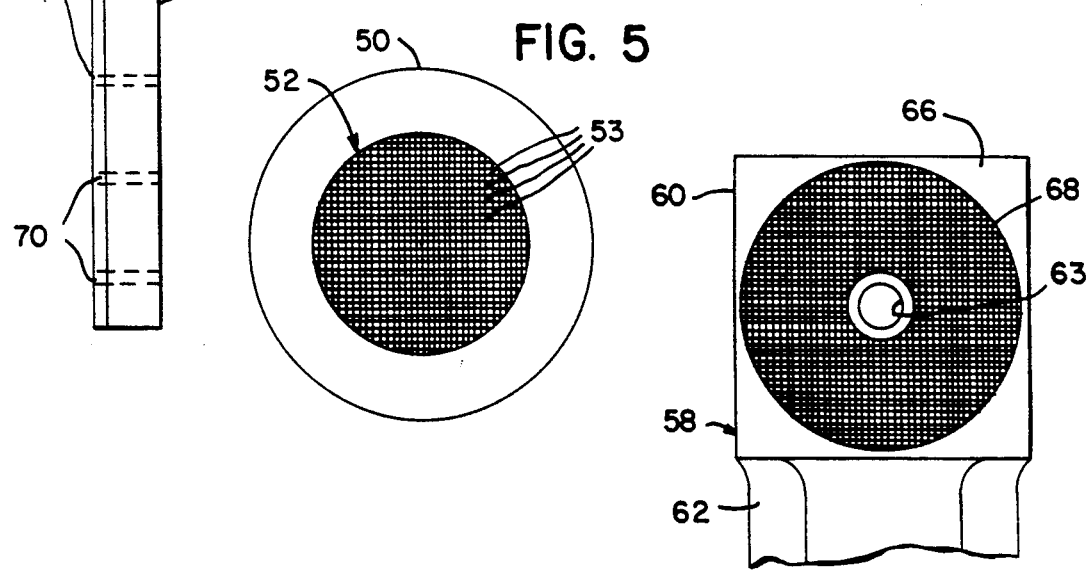
FIG. 5
FIG. 6

THERMAL CONNECTOR WITH AN EMBOSSED CONTACT FOR A CRYOGENIC APPARATUS

BACKGROUND OF THE INVENTION

The present invention relates to cryogenic apparatus such as superconducting electromagnet assemblies of magnetic resonance imaging equipment; and more particularly to cooling systems used in such apparatus.

Magnetic resonance imaging (MRI) systems generate extremely intense magnetic fields within an imaging volume defined by a tubular magnet assembly. In order to produce the intense magnetic fields with minimum power consumption, superconducting electromagnetic coils are employed in the assembly. However, conventional superconducting materials must be cooled to approximately ten degrees Kelvin or less before their resistivity is reduced to a point where they become superconducting. As a consequence, the superconducting coils typically are enclosed in a cryostat filled with liquid helium to maintain the coils at a low temperature.

An alternative system has been proposed in which a cryogenic refrigeration unit cools the magnet assembly to the superconducting temperature, thereby eliminating the need for liquid helium. The refrigeration unit is mechanically coupled to the magnet assembly by thermal conductors which are capable of being disconnected and reconnected for routine maintenance of the magnetic resonance imaging system. Therefore, thermal connectors are required which can be repeatedly broken and yet when attached, provide relatively high contact thermal conductance.

Contact thermal conductance is defined as the heat transfer rate divided by the contact surface area and temperature difference across an interface. A small temperature difference between different parts of the connector results in a large contact thermal conductance. Generally the science of contact conductance is concerned with maximizing the conductance and obtaining consistent, high levels of conductance. One of the most hostile environments in which to form a good thermal contact is in a vacuum which is the very environment necessary for superconducting magnet hardware and cryogenic systems in general. When metal-to-metal contacts are cycled in a vacuum, there is always the likelihood that local welding of the materials will occur as well as other forms of gross interface damage.

The present inventors considered using thermal connectors comprising a pair of copper fittings with mating surfaces machined to a high tolerance flatness and parallelism. A wafer of relatively soft thermally conductive material, such as indium, was clamped between the fittings which were held together by bolts. Under the clamping pressure, the indium wafer deformed into asperities in the surfaces of the fittings, thereby making a thermal, metal-to-metal contact. The soft metal wafers were kept thin because of their relative expense and lower thermal conductance than the copper components of the thermal conductor.

Even with the indium interface, a good metal-to-metal contact can be obtained only with very smooth, parallel surfaces. Contact conductance of this type of connection was found generally to be a function of the total force on the interface, but independent of interface area. The local metal-to-metal contact area is fixed by the plastic flow point of the soft metal wafer and an increase in the overall area of the interface did not increase the local contact area. Increasing the interface clamping force beyond a given amount did not result in a further increase in conductance. This effect results from the soft metal being hydrostatically constrained by its own frictional resistance from flowing between contacting regions and non-contacting regions of the interface. Under this hydrostatic constraint, materials bear stress well in excess of their plastic flow strengths.

In addition, the planar surfaces of the connector components, tend to oxidize during periods when the connection is broken and exposed to air. The oxide coating reduces the thermal conduction upon reconnection.

As a result, it is desirable to find a mechanism, or structure, which will alleviate these limitations of the thermal connectors.

SUMMARY OF THE INVENTION

A cryogenic system, such as a superconducting magnet assembly of magnetic resonance imaging equipment, is cooled to a temperature at which superconduction occurs (e.g. ten degrees Kelvin). The cooling is accomplished by a refrigeration unit that is conductively connected to the superconducting system.

The refrigeration unit has a first surface which is cooled to a desired temperature. A thermal conductor with a second surface is adjacent to the first surface. In one embodiment of the present invention the first surface end the conductor are made of copper. A body is bonded to one of the first and second surfaces, and is formed of a material, such as indium for example, that is more ductile than the material which forms the one surface.

An indenter is formed on the other of the first and second surfaces and penetrates the body. In the preferred embodiments the indenter has a triangular peak. For example, the indenter may be a spiraling peak or an array of pyramids projecting from the second surface. A mechanism holds said thermal conductor onto said refrigeration unit.

An object of the present invention is to provide a mechanism for thermally connecting a refrigeration unit to an apparatus to be cooled.

Another object is to provide such a thermal connection with a connector that can be repeatedly disconnected and reconnected for maintenance of the system.

BRIEF DESCRIPTION OF THE DRAWINGS

FIG. 2 is a cross-sectional view of a connector of a thermal conductor which couples the refrigeration unit to the electromagnet assembly in FIG. 1;

FIG. 5 is a plane view of another component of the connector incorporating the present invention; and FIG. 6 is a plane view of part of yet another component of the connector.

DESCRIPTION OF THE PRESENT INVENTION

Figure 1:
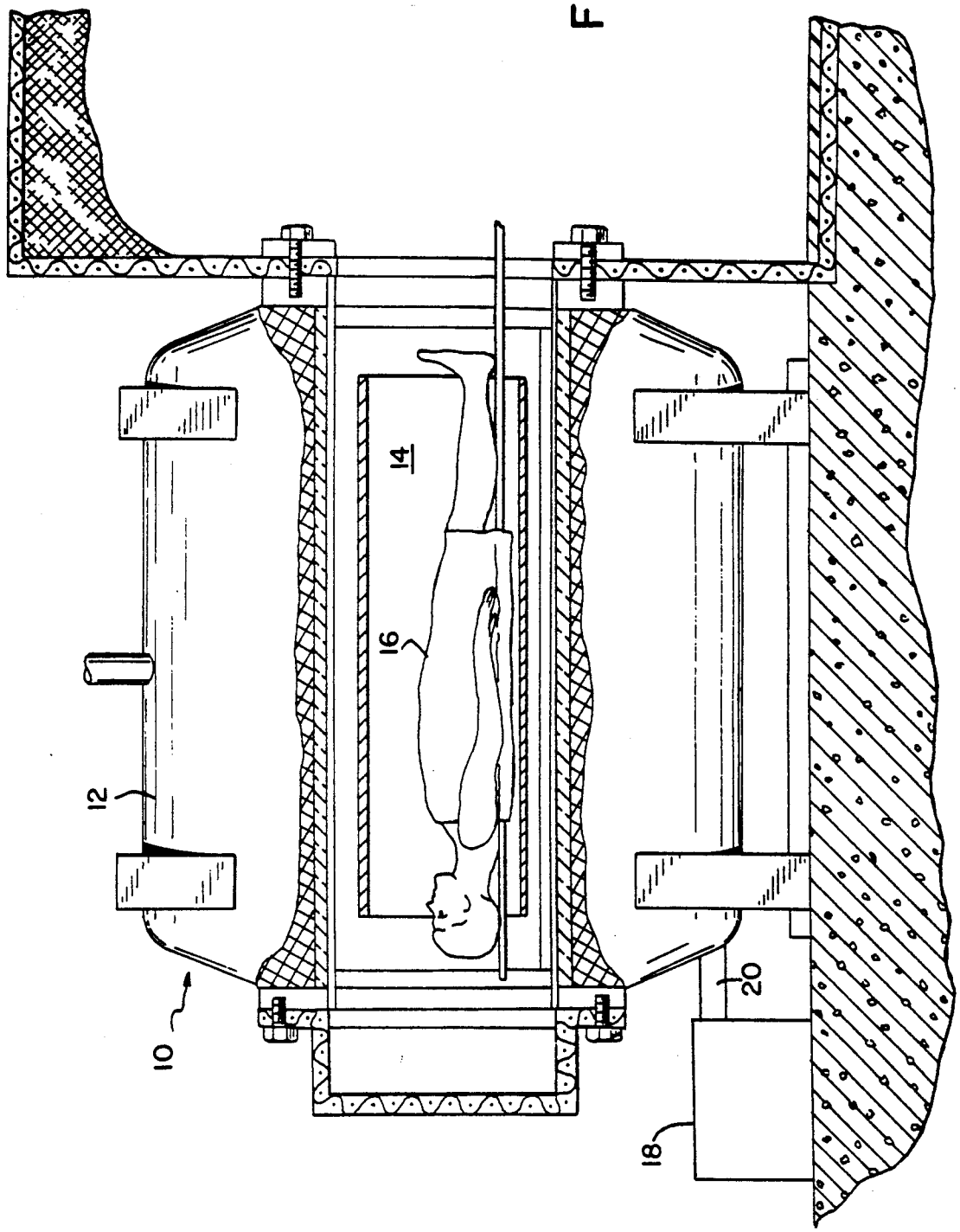
FIG. 1 is a partial cross-sectional view of an electromagnet assembly for an MRI system utilizing the present invention.

With initial reference to FIG. 1, a MRI system 10 includes a magnet assembly 12 formed by a plurality of superconducting electromagnet coils enclosed in a hollow cylindrical cryostat. The magnet assembly 12 has a generally cylindrical shape about a longitudinal axis defining an interior volume 14 within which an object 16, such as a medical patient, is placed for imaging. The magnet assembly is connected by a thermal conductor 20 to a cryogenic refrigeration unit 18 which are schematically depicted in the drawing. The refrigeration unit 18 cools the electromagnet coils to ten degrees Kelvin at which temperature the coils become superconducting.

With reference to FIG. 2, the refrigeration unit 18 has a cold head which fits within a sleeve 22 having a first stage 24 that reaches a temperature of forty degrees Kelvin during system operation and a second stage 25 which reaches ten degrees Kelvin. The cold head has a cylindrical shape about which one end of the thermal conductor 20 fits.

That end of the thermal conductor 20 has a connector which extends through an opening 27 in a vacuum vessel 26 of the magnet assembly 12 and is attached thereto by an annular mounting flange 28. The inner curved surface 29 of mounting flange 28 is brazed to one end of an outer metal tube 30. A second metal tube 32 is located concentrically within the first metal tube 30 and has a tubular body 34 brazed within one end. The first and second tubes 30 and 32 project from components 28 and 34, respectively, and are connected at their remote ends to form a relatively long thermal path length. This assembly of relatively thin (0.018 inch) first and second tubes 30 and 32 mechanically couples the or vacuum vessel 26 to components of the refrigeration unit 18 with a structure that has relatively low thermal conduction.

The copper tubular body 34 has a first end 36 abutting the end surface 23 of the first stage 24 of the cold head sleeve 22. In a manner that provides good thermal contact between those components. A second end 38 of body 34 has an annular groove cut therein which is filled with very pure (e.g. 99.99%) indium to form a first contact pad 40. During manufacture, molten indium is poured within the groove 40 and allowed to cool providing a good bond to the copper body 34. Then the second end 38 may be machined to have a flat surface which is perpendicular to the longitudinal axis of the tubular body 34. Although very pure indium is used in the exemplary MRI system, other soft metals, such as a lead/tin solder, could be used in other applications.

Figure 3:
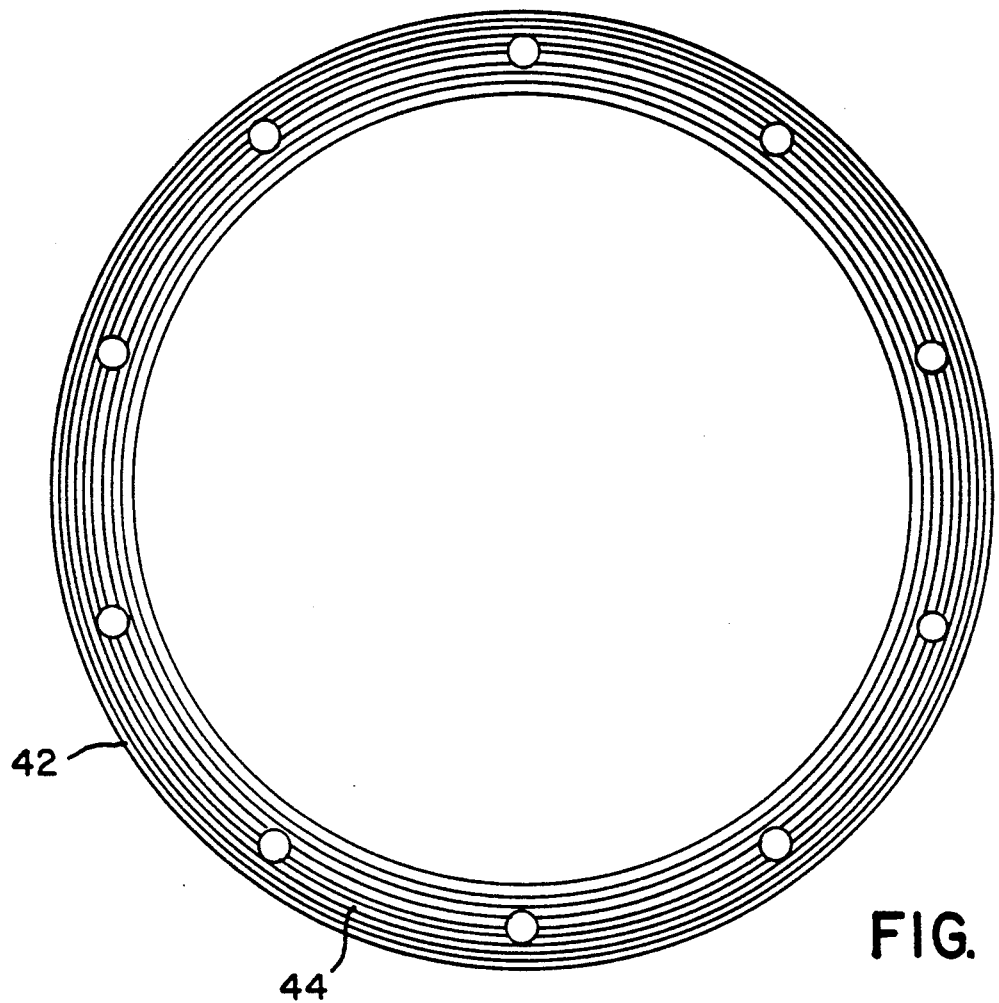
FIG. 3 is a plane view of the surface of a collar in the connector.
Figure 4:
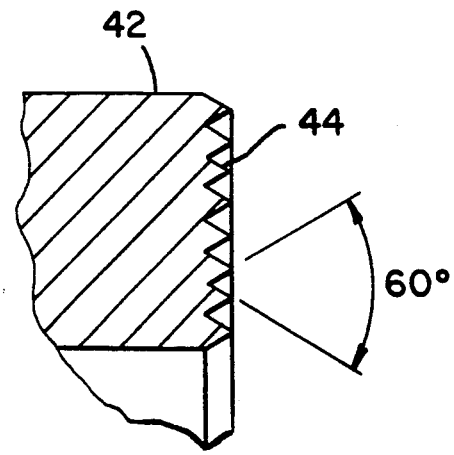
FIG. 4 is a partial cross-section through the collar.

A copper annular collar 42 abuts the second end 38 of body 34. FIG. 3 illustrates the surface of collar 42 that contacts the body 34. A plurality of concentric, circular V-shaped, grooves 44 are cut at an angle of sixty degrees in this end of the collar 42 with approximately a 0.04 inch pitch. FIG. 4 illustrates a cross section of the collar showing the grooves 44. The formation of the concentric grooves creates an indenter pattern of triangular peaks in circles on the end surface of the collar 42. Alternatively, the indenter pattern can comprise a spiral groove 44 cut in the end of the annular collar 42 at a similar angle and pitch.

Referring again to FIG. 2, a fastening ring 45 is aligned with the collar 42 with a braided copper shield 47 sandwiched therebetween. The combination of the fastening ring 45, shield 47 and collar 42 are bolted to the second end of body 34. As the bolts 43 holding the collar 42 to the body 34 are tightened, the copper points of the concentric grooves 44 penetrate the surface of the indium first contact pad 40, since the indium is softer and more ductile than the copper collar. The penetration establishes a metal-to-metal contact to a depth controlled by the flow strength of the indium. The contact surface area formed by the groove peaks is greater than that formed by planar surfaces of previous thermal connectors and thereby effectively increases the heat transfer between the collar and the indium. The indenter, in this case the peaks of the concentric grooves, is designed to penetrate sufficiently into the indium so that the slant length of the contact between the copper and indium is greater than the electron wavelength at the interface temperature. In the present case, the sides of the grooves are 0.04 inches and have the required penetration of the surface area at 70 PSI connection force. The displaced indium only flows a short distance into the nearby voids at the bottom of the concentric grooves 44. This avoids hydrostatic constraint of the indium that was prevalent with a flat indium gasket considered previously by the present inventors. The relatively deep penetration of 0.02 inches at the design connection force allows for relatively large surface misalignment from parallel as well as a greater tolerance for surface roughness. The indenter also breaks through any contamination layer of indium oxide on the surface of contact pad 40 that would appreciably increase the thermal resistance of a flat gasket contact.

When metal-to-metal contacts are cycled in a vacuum, there is always the likelihood that local welding of the materials will occur. If the first indium contact pad 40 welds to the copper collar 42, there is a possibility that a thermal bridge will be formed across the interface, thus rendering a disconnect ineffective. The indium pad of the embossed contact prevents this by being fused to the body 34 via a metallurgical bond. Local welding of the interface can be minimized further by a thin layer of chromium plated on the copper indenter of collar 42. This coating forms a non-adherent thin oxide layer. Thermal electrons can tunnel through the oxide without encountering the full thermal resistance of the chrome and the oxide.

The connection of the collar assembly to the body 34 thermally couples the shield 47 to the first stage 24 and maintains the shield at forty degrees Kelvin. The shield 47 provides an intermediate temperature buffer between the exterior of the vacuum vessel 26 which is approximately 300 degrees Kelvin and center conductive elements that are maintained at ten degrees Kelvin.

The second stage 25 of the refrigeration cold head sleeve 22 extends through the central opening of the body 34 and projects outward therefrom. A third tube 46, convoluted as shown, is around the second stage 25 spaced therefrom and fits snugly against the inner curved surface 49 of body 34 being brazed thereto for mechanical strength. The third tube 46 is made of stainless steel with walls that are sufficiently thin (0.018 inches) to minimize thermal conduction between the first and second stages 24 and 25 of the cryogenic refrigeration unit 18. A mid section of the third tube 46 is pleated to form a bellows 48. A copper disk 50 brazed within the end of the third tube 46 that is remote from the body 34.

As shown in FIG. 5, the inner surface 52 of the disk 50 is machined by cutting a parallel series of sixty degree V-shaped grooves 0.040 inches apart in two orthogonal directions. The machined pattern resembles knurling and has not been shown greatly enlarged in the drawings for ease of illustration. The machining forms an indenter pattern of a plurality of four-sided pyramids 53 that are 0.035 inches high. This pattern serves the same function as the concentric or spiral groove 44 on the end surface of collar 42, previously described. Although four sided pyramids are used in the illustrated embodiment different shaped pyramids or other peak structures can be used within the breadth of the present inventive concept.

Referring again to FIG. 2, when the conductor 20 is attached to the the refrigeration unit 18, the second stage 25 of the cold head sleeve 22 pushes against the inner surface 52 of the disk 50 exerting a force which tends to expand the bellows 48. The bellows 48 acts as a spring which drives the peaks of the pyramids 53 formed on surface 52 into a second indium contact pad 51 that is bonded to the end of the second stage 25. The penetration of the copper pyramids into the indium establishes good thermal contact between the disk 50 and the cold head sleeve 22.

The opposite surface 54 of disk 50 has a threaded aperture 55 at its center with an annular depression around the aperture which is filled with indium to form a third contact pad 56.

A connecting bar 58 has a head 60 from which an arm 62 extends. The head 60 has an aperture 63 through which a bolt 64 passes to connect the head to the disk 50. FIG. 6 shows the surface 66 of head 60 which abuts the disk 50. An annular area 68 around the central aperture 63 is machined in a similar manner to surface 52 of disk 50 to form an indenter pattern comprising a plurality of four-sided pyramids on surface 66 of the connecting arm 58. When the bolt 64 is tightened, the pyramids on surface 66 penetrate into the annular indium contact pad 56 on disk 50 providing a good thermal contact between those components of conductor 20. Removal of bolts 64 and 43 allows the conductor 20 to be disconnected from the refrigeration unit in order for the latter component to be serviced or replaced.

The arm 62 has seven threaded apertures 70 therein, which are used to bolt copper braid conductors (not shown) to the arm. The copper braid conductors thermally connect the arm 62 to components of the magnet assembly 12 to be cooled. The use of copper braid provides a good thermal path while isolating the magnet assembly from vibration.

One should appreciate that the embodiment of the present invention being described herein is but one example of how the present invention can be practiced. Other embodiments and variations of the described apparatus fall within the present inventive concept as defined by the following claims. For example, although the indium pad was illustrated on one surface of a mechanical interface and the indenter pattern was located on the mating surface, the location of these elements could be transposed on these surfaces.

The invention being claimed is:

1. In a cryogenic thermal system, a cooling apparatus comprising:
   a refrigeration unit have a contact surface which is cooled to a desired temperature;
   a thermal conductor having an interface surface adjacent to the contact surface of said refrigeration unit;
   a body bonded to one of the contact and interface surfaces, and formed of a material that is more ductile than material which forms that one surface;
   an indenter formed on another of the contact and interface surfaces to which the body is not bonded, and penetrating said body; and
   a mechanism which hold said thermal conductor onto said refrigeration unit.

2. The cooling apparatus as recited in claim 1 wherein said indenter comprises a triangular peak projecting from the contact or interface surface to which the body is not bonded.

3. The cooling apparatus as recited in claim 1 wherein said indenter comprises a plurality of circular peaks projecting from the contact or interface surface to which the body is not bonded.

4. The cooling apparatus as recited in claim 1 wherein said indenter comprises a spiral peak projecting from the contact or interface surface to which the body is not bonded.

5. The cooling apparatus as recited in claim 1 wherein said indenter comprises a plurality of pyramids projecting from the contact or interface surface to which the body is not bonded.

6. The cooling apparatus as recited in claim 1 wherein said mechanism comprises a spring which biases said thermal conductor against the contact surface.

7. The cooling apparatus as recited in claim 6 wherein said mechanism comprises a tubular bellows exerting force on said thermal conductor.

8. The cooling apparatus as recited in claim 6 wherein said body and said indenter both have circular shapes.

9. The cooling apparatus as recited in claim 1 wherein said mechanism comprises a bolt which passes through an aperture in said thermal conductor and engages a threaded aperture through the contact surface of said refrigeration unit.

10. The cooling apparatus as recited in claim 9 wherein:
    said body has an annular shape extending around the corresponding aperture in the one of the contact and interface surfaces; and
    said indenter has an annular shape extending around the corresponding aperture in the contact or interface surface to which the body is not bonded.

11. The cooling apparatus as recited in claim 1 wherein the material of said body is indium.

12. The cooling apparatus as recited in claim 11 wherein said indenter comprises a peak projecting from the contact or interface surface to which the body is not bonded, and the peak is coated with a layer of chromium.

13. In a cryogenic thermal system, a cooling apparatus comprising:
    a refrigeration unit having a contact surface of copper, which is cooled to a desired temperature and which has a indentation therein;
    an indium body within the indentation and being bonded to the contact surface;
    a copper thermal conductor having an interface surface on which an indenter is formed; and
    a mechanism which holds said thermal conductor abutting said indium body with the indenter penetrating said body.

14. The cooling apparatus as recited in claim 13 wherein said indenter comprises a triangular peak projecting from the interface surface.

15. The cooling apparatus as recited in claim 13 wherein said indenter comprises a spiral peak projecting from the interface surface.

16. The cooling apparatus as recited in claim 13 wherein said indenter comprises a plurality of circular peaks projecting from the interface surface.

17. The cooling apparatus as recited in claim 13 wherein said indenter comprises a plurality of pyramids projecting from the interface surface.

* * * * *